US010186636B2

United States Patent
Desieres

(10) Patent No.: US 10,186,636 B2
(45) Date of Patent: Jan. 22, 2019

(54) LIGHT-EMITTING DEVICE

(71) Applicant: COMMISSARIAT À L'ENERGIE ATOMIQUE ET AUX ENERGIES ALTERNATIVES, Paris (FR)

(72) Inventor: Yohan Desieres, Grenoble (FR)

(73) Assignee: COMMISSARIAT À L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 154 days.

(21) Appl. No.: 15/199,152

(22) Filed: Jun. 30, 2016

(65) Prior Publication Data
US 2017/0005230 A1    Jan. 5, 2017

(30) Foreign Application Priority Data
Jun. 30, 2015 (FR) ...................... 15 56152

(51) Int. Cl.
| | |
|---|---|
| *H01L 33/32* | (2010.01) |
| *H01L 33/38* | (2010.01) |
| *H01L 33/20* | (2010.01) |
| *H01L 33/22* | (2010.01) |
| *H01L 33/18* | (2010.01) |
| *H01L 33/24* | (2010.01) |
| *H01L 33/42* | (2010.01) |

(52) U.S. Cl.
CPC ............ *H01L 33/325* (2013.01); *H01L 33/18* (2013.01); *H01L 33/20* (2013.01); *H01L 33/22* (2013.01); *H01L 33/24* (2013.01); *H01L 33/38* (2013.01); *H01L 33/42* (2013.01)

(58) Field of Classification Search
None
See application file for complete search history.

(56) References Cited

U.S. PATENT DOCUMENTS

| | | | |
|---|---|---|---|
| 6,657,236 B1 | 12/2003 | Thibeault et al. | |
| 2008/0303047 A1 | 12/2008 | Shen et al. | |
| 2010/0052000 A1* | 3/2010 | Ko | H01L 33/14 257/98 |
| 2012/0280260 A1 | 11/2012 | Park | |
| 2012/0299040 A1 | 11/2012 | Kim et al. | |

OTHER PUBLICATIONS

Tsai et al.; "High Efficiency and Improved ESD Characteristics of GaN-Based LEDs With Naturally Textured Surface Grown by MOCVD;" IEEE Photonics Technology Letters; vol. 18, No. 11; Jun. 1, 2006; pp. 1213-1215.
Rivera et al.; "Assisted convective-capillary force assembly of gold colloids in a microfluidic cell: Plasmonic properties of deterministic nanostructures;" J. Vac. Sci. Technol. B; vol. 26, No. 6; Nov./Dec. 2008; pp. 2513-2519.

* cited by examiner

*Primary Examiner* — Alexander Ghyka
(74) *Attorney, Agent, or Firm* — Oliff PLC

(57) ABSTRACT

Device successively including a substrate including a metal layer capable of reflecting a radiation; a first layer of a III/N type alloy, p-type doped, and including a first surface, opposite the metal layer, the first surface being provided with cavities; a light-emitting layer made of a III/N-type alloy, capable of generating the radiation; a second layer of a III/N-type alloy, n-type doped, having the radiation coming out therethrough; wherein a non-metallic filling material transparent in the spectral range is arranged within the cavities.

16 Claims, 3 Drawing Sheets

LIGHT-EMITTING DEVICE

TECHNICAL FIELD

The present invention relates to a light-emitting device for emitting a radiation in a spectral range.

BACKGROUND ART

A known device of the state of the art successively comprises:
- a substrate comprising a metal layer capable of reflecting the radiation and of conducting an electric current;
- a first layer of a III/N-type alloy, p-type doped, and comprising a first surface, opposite the metal layer, provided with cavities;
- a light-emitting layer of a III/N-type alloy, capable of generating the radiation;
- a second layer of a III/N-type alloy, n-type doped, having the radiation coming out therethrough. The second layer has an external surface forming an interface with the exit medium. The outer surface of the second layer is textured to avoid for a major part of the generated radiation to be trapped within the device by internal total reflections.

Conventionally, such a device of the state of the art is obtained by successive epitaxies of the second layer, of the light-emitting layer, and of the first layer on a growth substrate, made of sapphire or of AlGaN. Then, the metal layer is formed on the epitaxial layers. The assembly is then transferred onto a host substrate which is a good heat conductor. Finally, the growth substrate is suppressed by laser lift-off. The texturing of the outer surface of the second layer is obtained by a selective chemical etching based on KOH.

Crystal mesh and thermal expansion coefficient mismatches between sapphire and III/N-type alloys result in dislocations through the epitaxial layers. The dislocations result in the presence of defects in the epitaxial layers. More specifically, III/N-type alloys have a wurtzite-type hexagonal crystal structure, and the defects take the shape of cavities, emerging at the level of the dislocations, particularly at the first surface of the first layer. The cavities conventionally form hollow patterns in the shape of an upside-down pyramid having a hexagonal base (V-pits); the tops of the pyramids point towards a dislocation or a group of dislocations. Such cavities form a natural texturing of the first surface of the first layer, and are filled with metal on forming of the metal layer.

Such cavities would be advantageous for the extraction of light, due to their diffusing power, as suggested in C. M. Tsai et al., "*High efficiency and improved ESD characteristics of GaN-based LEDs with naturally textured surface grown by MOCVD*", Photonics Technology Letters, IEEE, vol. 18 (11), 2006, pp. 1213-1215.

However, as illustrated in FIG. 5, the applicant has observed that the total reflection, that is, the specular and diffuse reflection, of the radiation at the interface between the metal layer and the first surface of the first layer decreases when the cavity density increases, which is prejudicial to obtain a high light extraction efficiency (that is, greater than 50%) and a high efficiency of the device, the device efficiency being the ratio of the available optical watts to the injected electrical watts.

SUMMARY OF THE INVENTION

Thus, the present invention aims at overcoming all or part of the abovementioned disadvantages, and relates for this purpose to a light-emitting device for emitting a radiation in a spectral range, the device successively comprising:
- a substrate comprising a metal layer capable of reflecting the radiation;
- a first layer of a III/N type alloy, p-type doped, and comprising a first surface, opposite the metal layer, the first surface being provided with cavities;
- a light-emitting layer of a III/N-type alloy, capable of generating the radiation;
- a second layer of a III/N-type alloy, n-type doped, having the radiation coming out therethrough;

The device being remarkable in that a filling material, non-metallic and transparent in the spectral range, is arranged within the cavities.

"Spectral range" means the wavelength or the wavelength band of the emitted radiation. The spectral range preferably belongs to the ultraviolet or visible range.

"Metal layer" means a layer (or a plurality of sub-layers) of a metallic material, where the metallic material may be a pure metal or a metal alloy.

"III/N alloy" means a nitride of at least one element from column III of the periodic table of elements.

"P-type doped (respectively n-type doped)" means that the corresponding alloy comprises impurities capable of favoring an electric conduction by holes (respectively by electrons).

"Transparent" means that the filling material has an extinction coefficient smaller than or equal to 0.1 in the spectral range.

Thus, such a device according to the invention enables, as compared with the state of the art, to decrease absorption losses at the interface between the metal layer and the first surface of the first layer, and this due to such a filling material. Such a device according to the invention thereby enables to increase the total reflection of the radiation at said interface, and thus the extraction of light. Absorption losses are all the smaller as the surface density of cavities at the first surface is high. The filling material is non-metallic to also avoid an optical coupling between the radiation generated by the light-emitting layer and surface plasmons at the first surface of the first layer.

In an embodiment, the filling material forms a planar layer extending between the metal layer and the first surface of the first layer, and the filling material is electrically conductive.

"Electrically conductive" means that the filling material has an electric conductivity at 300 K in the range from $10^3$ to $10^4$ S/cm.

Thus, such a planar layer, interposed between the first surface of the first layer and the metal layer, enables to avoid a leveling of the first surface of the first layer (for example, by chemical-mechanical polishing) and thereby to avoid a degradation of the electric performance of the first layer. Such a planar layer prevents any direct contact between the first surface of the first layer and the metal layer. The filling material is thus electrically conductive to allow a biasing of the device.

Advantageously, the filling material is an oxide, preferably selected from the group comprising indium-tin oxide, aluminum-doped zinc oxide ZnO, indium-doped zinc oxide ZnO, gallium-doped zinc oxide ZnO.

Thus, such materials are electrically conductive and have an optical index close to that of a III/N-type alloy, for example, GaN (n=2.45 at 450 nm). Further, such transparent conductive oxides may be simply formed at the first surface of the first layer. Indium tin oxide is particularly advantageous since it is an excellent hole injector.

In an embodiment, the filling material is flush with the first surface of the first layer, and the first surface of the first layer is in contact with the metal layer.

Thus, a greater freedom of choice of the filling material is allowed since the electric conduction is provided by the first layer. The filling material may thus be an electrically conductive material or a dielectric material.

"Dielectric" means that the filling material has an electric conductivity at 300 K smaller than $10^{-8}$ S/cm.

"Flush with" means that the filling material:
reaches the level of the first surface of the first layer, or
protrudes or is recessed from the first surface of the first layer by a maximum distance smaller than or equal to 10 nm.

Advantageously, the filling material is selected from the group comprising titanium dioxide $TiO_2$, silicon dioxide $SiO_2$, zinc oxide ZnO, aluminum-doped zinc oxide ZnO, indium-doped zinc oxide ZnO, gallium-doped zinc oxide ZnO, silicon nitride SiN, indium tin oxide.

Thus, such filling materials have an optical index close to that of a III/N-type alloy, for example, GaN (n=2.45 at 450 nm), and may be simply formed within the cavities.

In an embodiment, the filling material forms dielectric balls, and the first surface of the first layer is in contact with the metal layer.

Such dielectric balls are advantageously formed by evaporation of a colloidal suspension.

Advantageously, the filling material is selected from the group comprising titanium dioxide $TiO_2$, silicon nitride SiN, silicon dioxide $SiO_2$, zinc oxide ZnO.

Advantageously, the metal layer is based on silver or on aluminum.

Advantageously, the alloy of the first and second layers and of the light-emitting layer is a binary alloy or a ternary alloy, the binary alloy being preferably based on GaN, the ternary alloy being preferably based on InGaN or on AlGaN.

Advantageously, the cavities have a surface density greater than $10^8$ cm$^{-2}$ at the first surface of the first layer.

BRIEF DESCRIPTION OF THE DRAWINGS

The foregoing and other features and advantages will be discussed in detail in the following non-limiting description of different embodiments of the invention, in connection with the accompanying drawings, among which.

DETAILED DESCRIPTION OF THE EMBODIMENTS

Figure 1:
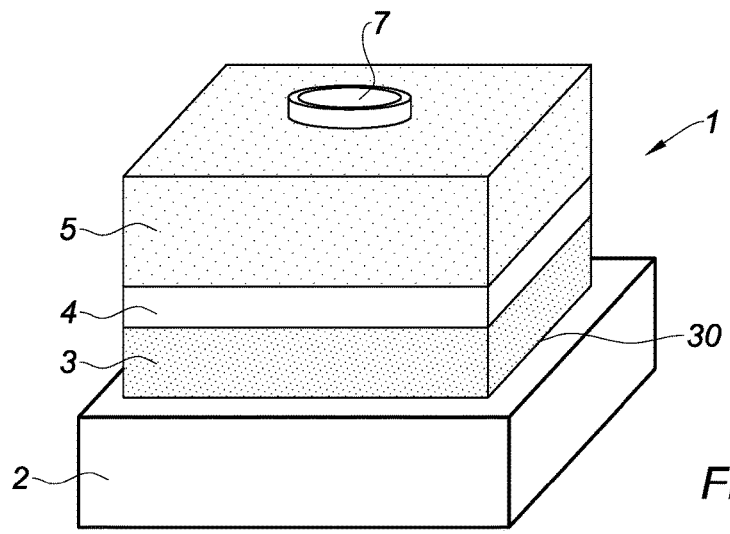
FIG. 1 is a simplified perspective view of a device according to the invention.

For the different embodiments, the same references will be used for identical elements or elements performing the same function, to simplify the description. The technical characteristics described hereafter for different embodiments are to be considered separately or according to any technically possible combination.

The device illustrated in FIGS. 1 to 8 is a light-emitting device 1 for emitting a radiation in a spectral range, the device successively comprising:
a substrate 2 comprising a metal layer 20 capable of reflecting the radiation;
a first layer 3 of a III/N type alloy, p-type doped, and comprising a first surface 30, opposite metal layer 20, first surface 30 being provided with cavities 300;
a light-emitting layer 4 of a III/N-type alloy, capable of generating the radiation;
a second layer 5 of a III/N-type alloy, n-type doped, having the radiation coming out therethrough.

A non-metallic filling material 6 transparent in the spectral range, is arranged within cavities 300. Filling material 6 is different from the material of substrate 2.

A contact pad 7 is advantageously formed on second layer 5.

Device 1 is preferably a light-emitting diode, more preferably of VTF (Vertical Thin Film) technology or TFFC (Thin Film Flip Chip) technology. The spectral range is preferably the ultraviolet or visible range, between 200 nm and 780 nm.

Metal layer 20 is made of a metallic material, the metallic material being a pure metal or a metal alloy. The metallic material is advantageously based on silver or on aluminum. Metal layer 20 may comprise sub-layers of a metallic material. Metal layer 20 forms a reflective mirror capable of reflecting the radiation. Metal layer 20 advantageously has a reflection coefficient greater than 0.8, preferably greater than 0.9, to obtain a high optical extraction efficiency. Metal layer 20 is capable of conducting an electric current. Metal layer 20 enables to bias device 1 by carrier injection.

Figure 6:
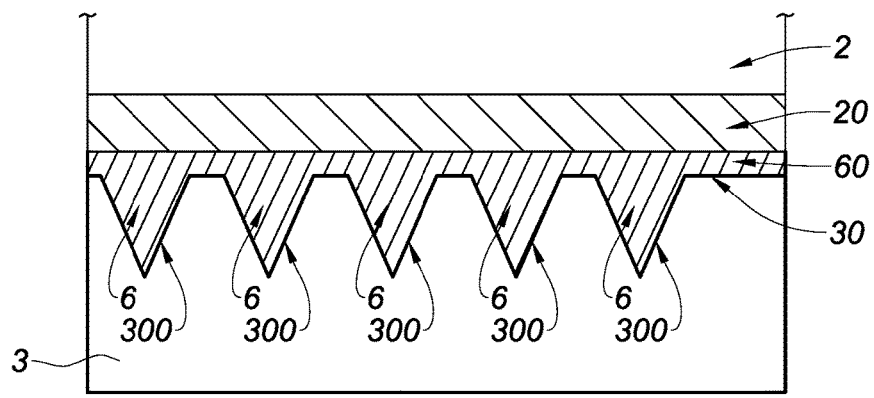
FIG. 6 is a partial simplified cross-section view of a device according to the first embodiment illustrating the metal layer.
Figure 7:
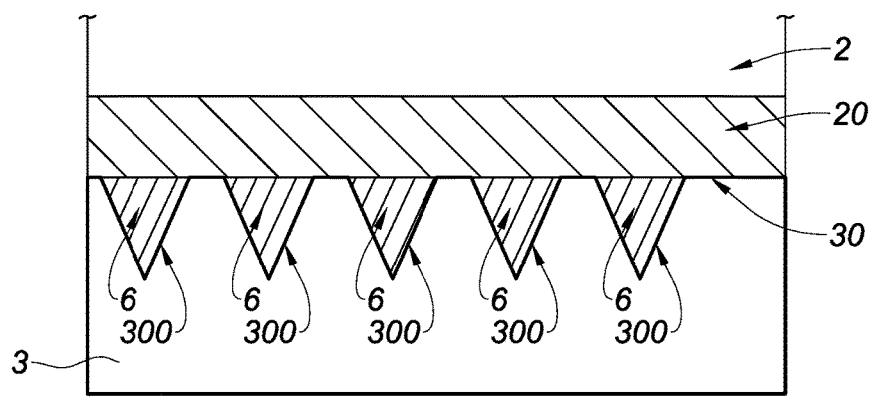
FIG. 7 is a partial simplified cross-section view of a device according to the second embodiment illustrating the metal layer.
Figure 8:
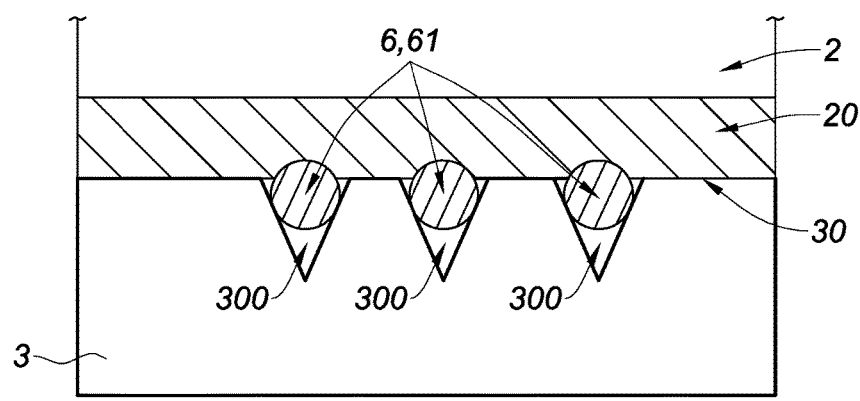
FIG. 8 is a partial simplified cross-section view of a device according to the third embodiment illustrating the metal layer.

Metal layer 20 extends at least partially in contact with filling material 6. Metal layer 20 extends between substrate 2 and filling material 6. In other words, device 1 successively comprises substrate 2, metal layer 20, filling material 6, first layer 3, as illustrated in FIGS. 6 to 8.

The alloy of first and second layers 3, 5 and of light-emitting layer 4 is advantageously a binary alloy or a ternary alloy, the binary alloy being preferably based on GaN, the ternary alloy being preferably based on InGaN or on AlGaN. Light-emitting layer 4 may comprise light-emitting sub-layers. Second layer 5 has an external surface forming an interface with the exit medium. The outer surface of second layer 5 is advantageously textured to avoid for a major part of the generated radiation to be trapped within device 1 by internal total reflections. The texturing of the outer surface of second layer 5 is preferably obtained by a selective chemical etching based on KOH. First and second layers 3, 5, and light-emitting layer 4 are preferably formed on an epitaxial growth substrate. The growth substrate is preferably made of sapphire when the spectral range is the visible range; the growth substrate is preferably made of AlGaN when the spectral range is the ultraviolet range. After the forming of metal layer 20 and transferring the assembly onto substrate 2 (host substrate), the growth substrate is preferably suppressed by laser lift-off.

Cavities 300 form hollow patterns in the shape of an upside-down pyramid having a hexagonal base (V-pits, the cross-section being V-shaped). The tops of the pyramids point towards a dislocation or a group of dislocations. Cavities 300 generally have a surface density in the range from $10^8$ to $10^{10}$ cm$^{-2}$ at first surface 30 of first layer 3. The applicant has observed that the total reflection, that is, the specular and diffuse reflection, of the radiation at the interface between metal layer 20 and first surface 30 of first layer 3 significantly decreases from a surface density in the order of $10^8$ cm$^{-2}$. Cavities 300 have a depth (that is, the pyramid height) in the order of 150 nm, and a diameter (that is, the diameter of the substantially regular hexagon forming the base of the pyramid) in the order of 100 nm.

Figure 2:
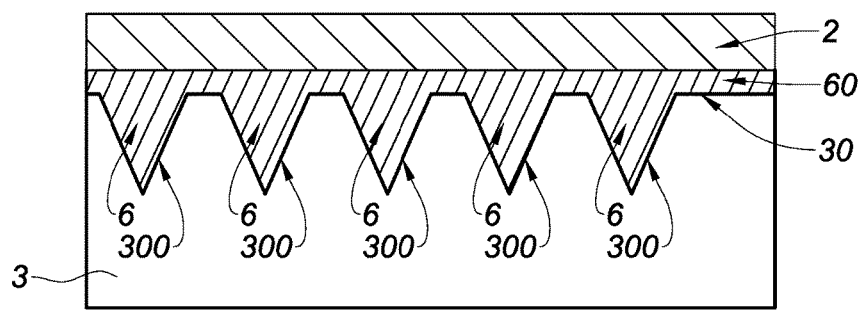
FIG. 2 is a partial simplified cross-section view of a device according to a first embodiment of the invention.

In an embodiment illustrated in FIG. 2, filling material 6 forms a planar layer 60 extending between metal layer 20 and first surface 30 of first layer 3, and filling material 6 is electrically conductive. Filling material 6 advantageously is an oxide, preferably selected from the group comprising indium-tin oxide, aluminum-doped zinc oxide ZnO, indium-doped zinc oxide ZnO, or gallium-doped zinc oxide ZnO. The doping level is adapted according to the desired conduction level. Filling material 6 is deposited on first surface 30 of first layer 3 before the forming of metal layer 20. Planar layer 60 is advantageously obtained by chemical-mechanical polishing. Planar layer 60 prevents any direct contact between first layer 3 and metal layer 20.

Figure 3:
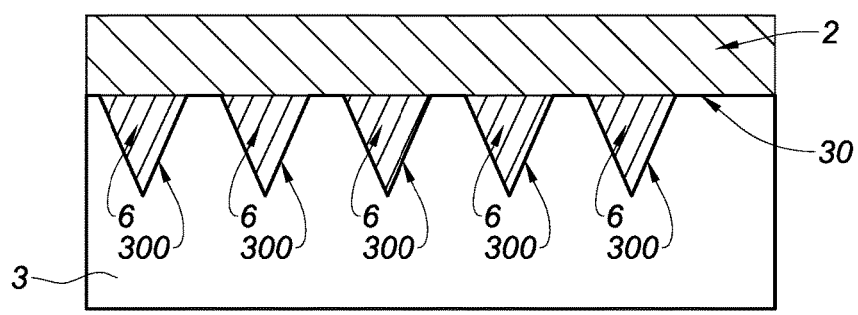
FIG. 3 is a partial simplified cross-section view of a device according to a second embodiment of the invention.

In an embodiment illustrated in FIG. 3, filling material 6 is flush with first surface 30 of first layer 3, and first surface 30 of first layer 3 is in contact with metal layer 20. Filling material 6 is deposited on first surface 30 of first layer 3 before the forming of metal layer 20. Then, the flush state is preferably obtained by a chemical-mechanical polishing of filling material 6 down to first surface 30 of first layer 3. Filling material 6 is advantageously selected from the group comprising titanium dioxide TiO$_2$, silicon dioxide SiO$_2$, zinc oxide ZnO, aluminum-doped zinc oxide ZnO, silicon nitride SiN, indium tin oxide. Metal layer 20 is in direct contact with first layer 3 and filling material 6.

Figure 4:
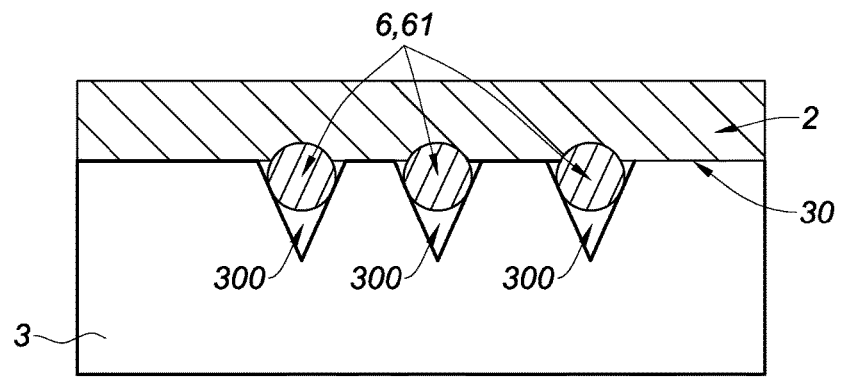
FIG. 4 is a partial simplified cross-section view of a device according to a third embodiment of the invention, FIG. 5 (already discussed) is a graph showing the total reflectivity of the interface between the metal layer (Ag) and the first surface of the first layer (GaN) of a device of the state of the art (axis of ordinates, in %) according to the wavelength of the emitted radiation (axis of abscissas, in nm) for different densities d of cavities (A: d=2·10$^9$ cm$^{-2}$, B: d=10$^9$ cm$^{-2}$, C: d=2·10$^8$ cm$^{-2}$, D: d=0)
Figure 5:
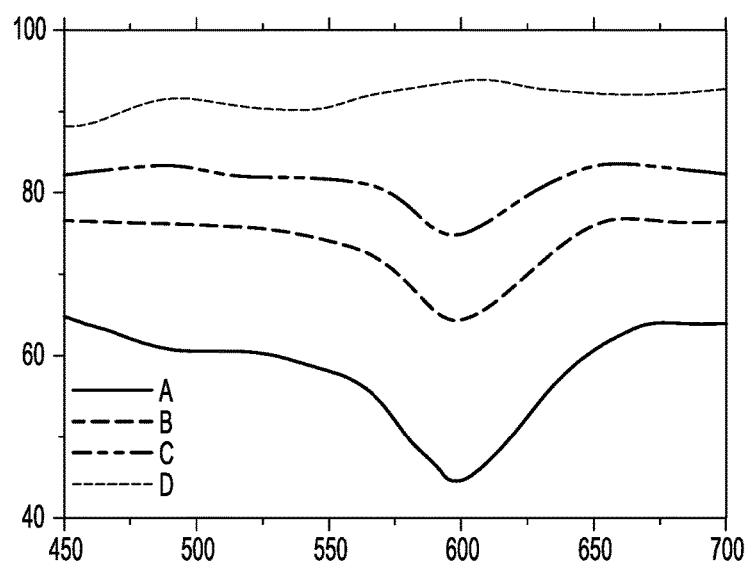

In an embodiment illustrated in FIG. 4, filling material 6 forms dielectric balls 61, and first surface 30 of first layer 3 is in contact with metal layer 20. Such dielectric balls 61 are advantageously formed by evaporation of a colloidal suspension, an example of implementation thereof being given in T. Pinedo et al, "*Assisted convective-capillary force assembly of gold colloids in a microfluid cell: Plasmonic properties of deterministic nanostructures*", J. Vac. Sci. Technol., B 26(6), 2008, p. 2513-2519. This embodiment is advantageous since such a filling material 6 has a good flatness. A plurality of dielectric balls 61 may also occupy a cavity 300. Dielectric balls 61 advantageously have a radius in the range from 2 nm to 20 nm, so that filling material 6 protrudes or is recessed from first surface 30 of first layer 3 by a maximum distance smaller than or equal to 10 nm. A roughness of filling material 6 greater than 10 nm significantly alters the reflection of the radiation at the interface between filling material 6 and metal layer 20 by increasing the absorption. Further, such a radius of dielectric balls 61, much smaller than the size of cavities 300, enables a plurality of dielectric balls 61 to occupy a cavity 300, which enables to adapt to different sizes of cavities 300. Further, as small as possible a size of dielectric balls 61 will be searched for. Filling material 6 is advantageously selected from the group comprising titanium dioxide TiO$_2$, silicon nitride SiN, silicon dioxide SiO$_2$, zinc oxide ZnO.

The invention claimed is:

1. A light-emitting device for emitting a radiation in a spectral range, successively including:
   a substrate including a metal layer capable of reflecting the radiation;
   a first layer of a III/N type alloy, p-type doped, and comprising a first surface, opposite the metal layer, the first surface being provided with cavities;
   a light-emitting layer of a III/N-type alloy, capable of generating the radiation;
   a second layer of a III/N-type alloy, n-type doped, having the radiation coming out therethrough;
   wherein a filling material, which is not a pure metal or a metal alloy and is transparent in the spectral range, is arranged within the cavities, and wherein the filling material alone or together with the first layer forms a planar surface and interface with the substrate or with the metal layer, the planar surface being continuous.

2. The device according to claim 1, wherein the filling material forms a planar interface with the metal layer or with the substrate, and the filling material is electrically conductive to electrically connect the substrate with the first layer, the first layer being completely separated from the substrate by the filling material.

3. The device according to claim 2, wherein the filling material is an oxide selected from the group consisting of indium-tin oxide, aluminum-doped zinc oxide ZnO, indium-doped zinc oxide ZnO, and gallium-doped zinc oxide ZnO.

4. The device according to claim 1, wherein the filling material and the first surface of the first layer respectively form first and second coplanar interfaces with the substrate or respectively form first and second coplanar interfaces with the metal layer.

5. The device according to claim 4, wherein the filling material is selected from the group consisting of titanium dioxide TiO$_2$, silicon dioxide SiO$_2$, zinc oxide ZnO, aluminum-doped zinc oxide ZnO, indium-doped zinc oxide ZnO, gallium-doped zinc oxide ZnO, silicon nitride SiN, and indium tin oxide.

6. The device according to claim 1, wherein the metal layer is based on silver or on aluminum and has a planar face facing the first surface of the first layer to reflect the radiation.

7. The device according to claim 1, wherein the alloy of the first and second layers and of the light-emitting layer is a binary alloy based on GaN, or a ternary alloy based on InGaN or on AlGaN.

8. The device according to claim 1, wherein the cavities have a surface density greater than $10^8$ cm$^{-2}$ at the first surface of the first layer.

9. The device according to claim 2, wherein the cavities are fully filled with the filling material.

10. The device according to claim 4, wherein the cavities are fully filled with the filling material.

11. The device according to claim 4, wherein the filling material is an electrically insulating material.

12. The device according to claim 1, wherein the metal layer forms a planar mirror reflecting the radiation.

13. A light-emitting device for emitting a radiation in a spectral range, successively including:
   a substrate including a metal layer;
   a first layer of a III/N type alloy, p-type doped, and comprising a first surface, opposite the metal layer, the first surface being provided with cavities;

a light-emitting layer of a III/N-type alloy, capable of generating the radiation;

a second layer of a III/N-type alloy, n-type doped, having the radiation coming out therethrough;

wherein a filling material, which is not a pure metal or a metal alloy and is transparent in the spectral range, is arranged within the cavities, and wherein the cavities are fully filled by the filling material, the filling material forms a planar surface either alone or together with a surface of the first layer, the planar surface being continuous.

14. A light-emitting device for emitting a radiation in a spectral range, successively including:

a substrate including a metal layer;

a first layer of a III/N type alloy, p-type doped, and comprising a first surface, opposite the metal layer, the first surface being provided with cavities, the first surface of the first layer being in contact with the metal layer and defining a first plane;

a light-emitting layer of a III/N-type alloy, capable of generating the radiation;

a second layer of a III/N-type alloy, n-type doped, having the radiation coming out therethrough;

wherein a filling material, which is not a pure metal or a metal alloy and is transparent in the spectral range, is arranged within the cavities, the filling material forming dielectric balls and the dielectric balls protrudes from the first plane.

15. The device according to claim 14, wherein the filling material is selected from the group consisting of titanium dioxide $TiO_2$, silicon nitride SiN, silicon dioxide $SiO_2$, and zinc oxide ZnO.

16. The device according to claim 14, wherein the dielectric balls contact the substrate.

* * * * *